(12) United States Patent
Hayashi

(10) Patent No.: US 11,282,617 B2
(45) Date of Patent: Mar. 22, 2022

(54) WIRE HARNESS

(71) Applicant: SUMITOMO WIRING SYSTEMS, LTD., Yokkaichi (JP)

(72) Inventor: Masashi Hayashi, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 0 days.

(21) Appl. No.: 16/981,748

(22) PCT Filed: Mar. 12, 2019

(86) PCT No.: PCT/JP2019/009857
§ 371 (c)(1),
(2) Date: Sep. 17, 2020

(87) PCT Pub. No.: WO2019/188230
PCT Pub. Date: Oct. 3, 2019

(65) Prior Publication Data
US 2021/0125742 A1    Apr. 29, 2021

(30) Foreign Application Priority Data

Mar. 30, 2018 (JP) .............................. JP2018-069923

(51) Int. Cl.
*H01B 7/00*    (2006.01)
*H01B 7/40*    (2006.01)
(Continued)

(52) U.S. Cl.
CPC ............. *H01B 7/0045* (2013.01); *H01B 7/40* (2013.01); *H02G 15/013* (2013.01); *H01R 4/183* (2013.01)

(58) Field of Classification Search
None
See application file for complete search history.

(56) References Cited

U.S. PATENT DOCUMENTS 1,984,356 A * 12/1934 Abbott .................. H02G 3/105
174/502
4,963,104 A * 10/1990 Dickie ................. H01R 13/595
439/460

(Continued)

FOREIGN PATENT DOCUMENTS

CN   111987683 A  * 11/2020
DE   112015006759 T5 * 4/2018 ......... H01R 13/6593
(Continued)

OTHER PUBLICATIONS

Apr. 9, 2019 International Search Report issued in International Patent Application No. PCT/JP2019/009857.

*Primary Examiner* — Timothy J. Dole
*Assistant Examiner* — Muhammed Azam
(74) *Attorney, Agent, or Firm* — Oliff PLC

(57) ABSTRACT

A wire harness that includes an electric wire that includes a core wire, an insulating inner cover that covers an outer circumference of the core wire, and a conductive shield that covers an outer circumference of the insulating inner cover; a conductive bracket including a plate that includes an insertion hole through which the electric wire is inserted and a protrusion protruding from an edge of the insertion hole in the plate; a fastener that fastens a folded-back portion of the shield that is folded back to an outer circumferential side of the protrusion to the protrusion; and a body made of resin that sandwiches the plate in a thickness direction.

6 Claims, 6 Drawing Sheets

(51) Int. Cl.
*H02G 15/013* (2006.01)
*H01R 4/18* (2006.01)

(56) References Cited

U.S. PATENT DOCUMENTS

| | | | | |
|---|---|---|---|---|
| 5,473,117 A * | 12/1995 | Morgan | ................. | H01R 4/646 |
| | | | | 174/74 R |
| 5,691,506 A * | 11/1997 | Miyazaki | ............... | H01R 4/646 |
| | | | | 174/652 |
| 6,010,134 A * | 1/2000 | Katoh | ................ | B60R 16/0222 |
| | | | | 174/152 G |
| 6,259,028 B1 * | 7/2001 | Senma | ................ | B60R 16/0207 |
| | | | | 174/152 G |
| 6,261,108 B1 * | 7/2001 | Kanagawa | ........... | H01R 13/6592 |
| | | | | 439/98 |
| 6,398,563 B1 * | 6/2002 | Kanagawa | ........... | H01R 9/0518 |
| | | | | 439/587 |
| 6,419,521 B2 * | 7/2002 | Kanagawa | ........... | H01R 13/6592 |
| | | | | 439/582 |
| 6,524,121 B2 * | 2/2003 | Kanagawa | ........... | H01R 9/0518 |
| | | | | 439/95 |
| 6,530,789 B2 * | 3/2003 | Konda | ................ | H01R 9/0518 |
| | | | | 439/98 |
| 6,558,172 B2 * | 5/2003 | Kanagawa | ........... | H01R 9/0524 |
| | | | | 439/582 |
| 6,814,617 B2 * | 11/2004 | Oota | ................. | H01R 13/5205 |
| | | | | 174/365 |
| 6,815,610 B2 * | 11/2004 | Kuboshima | ........ | H01R 13/5845 |
| | | | | 174/360 |
| 9,045,092 B2 * | 6/2015 | Toyama | ............... | B60R 16/0215 |
| 9,270,060 B2 * | 2/2016 | Adachi | .............. | H01R 13/6596 |
| 9,327,660 B2 * | 5/2016 | Suetani | ................ | H02G 15/046 |
| 9,660,355 B2 * | 5/2017 | Kato | ................... | H01R 13/6591 |
| 10,103,527 B2 * | 10/2018 | Omura | ..................... | H01B 7/18 |
| 10,158,192 B1 * | 12/2018 | Yokotani | ........... | H01R 13/5845 |
| 10,910,734 B2 * | 2/2021 | Hamada | ................. | H01R 4/185 |
| 2002/0062979 A1 * | 5/2002 | Murakami | ........... | H01B 7/0861 |
| | | | | 174/117 F |
| 2002/0125033 A1 * | 9/2002 | Blake | ...................... | H02G 3/18 |
| | | | | 174/653 |
| 2003/0094301 A1 * | 5/2003 | Takedomi | ............. | H02G 3/083 |
| | | | | 174/659 |
| 2015/0027772 A1 * | 1/2015 | Hashimoto | .......... | H05K 9/0052 |
| | | | | 174/382 |
| 2015/0064992 A1 | 3/2015 | Kato et al. | | |
| 2019/0320561 A1 * | 10/2019 | Lim | ...................... | H01L 28/60 |
| 2021/0125742 A1 * | 4/2021 | Hayashi | ................... | H01B 7/40 |

FOREIGN PATENT DOCUMENTS

| | | | | |
|---|---|---|---|---|
| DE | 112019001728 T5 * | 12/2020 | ........... | H01B 7/0275 |
| JP | 2005-285748 A | 10/2005 | | |
| JP | 2018045976 A * | 3/2018 | ............... | H01R 4/20 |
| JP | 2018046235 A * | 3/2018 | ............. | H02G 3/083 |
| JP | 2018046704 A * | 3/2018 | ............ | B60R 16/0222 |
| WO | WO-2019069725 A1 * | 4/2019 | ........ | B60R 16/0215 |
| WO | WO-2020183940 A1 * | 9/2020 | ................ | H05K 9/00 |

* cited by examiner ated to an attached body.

WIRE HARNESS

BACKGROUND

The present disclosure relates to a wire harness including an electric wire that includes a core wire, an insulating inner cover that covers an outer circumference of the core wire, and a conductive shield member that covers an outer circumference of the insulating inner cover.

Some wire harnesses for vehicles include, for example, an electric wire that includes a core wire, an insulating inner cover that covers an outer circumference of the core wire, a conductive shield member that covers an outer circumference of the insulating inner cover, and an insulating outer cover that covers an outer circumference of the shield member. In addition, a structure in which a shield member is grounded has been proposed (see JP 2005-285748A, for example).

In the wire harness described in JP 2005-285748A, an end portion of the shield member is exposed from an end portion of the insulating outer cover, and the exposed portion is folded back to an outer circumferential side of the insulating outer cover.

A tubular member (shield sleeve) is provided between the outer circumferential surface of the end portion of the insulating outer cover and the folded-back portion of the shield member.

The folded-back portion of the shield member is fitted into a conductive tubular body (shield contact). The tubular body is inserted into an insertion hole of a plate-shaped ground member and attached to the ground member, and the ground member is attached to an attached body.

SUMMARY

In the wire harness described in JP 2005-285748A, the insertion hole of the ground member and the tubular body are separate bodies.

Also, in order to suppress deformation of the core wire when the folded-back portion of the shield member is fitted into the tubular body, a tubular member is provided between the insulating outer cover and the folded-back portion of the shield member.

Accordingly, the number of components for connecting the shield member to the ground increases, and the assembling operation becomes complicated.

An exemplary aspect of the disclosure provides a wire harness in which a shield member can be grounded with a simple configuration.

A wire harness according to an exemplary aspect includes an electric wire that includes a core wire, an insulating inner cover that covers an outer circumference of the core wire, and a conductive shield that covers an outer circumference of the insulating inner cover, and the wire harness includes: a conductive bracket that includes a plate including an insertion hole through which the electric wire is inserted and a protrusion protruding from an edge of the insertion hole in the plate; and a fastener that fastens a folded-back portion of the shield that is folded back to an outer circumferential side of the protrusion to the protrusion.

With this configuration, the shield of the electric wire is electrically connected to the bracket by folding back the portion of the shield of the electric wire protruding from the end of the protrusion of the plate to the outer circumferential side of the protrusion, and fastening the folded-back portion to the protrusion with the fastener. By attaching the bracket to a conductive attachment object, the shield can be grounded.

Here, because the protrusion is interposed between the fastener and the electric wire, deformation of the electric wire due to fastening by the fastener is suppressed.

Therefore, the shield can be grounded with a simple configuration.

In the above wire harness, it is preferable that the bracket includes a plurality of the insertion holes and a plurality of the protrusions respectively protruding from edges of the insertion holes.

With this configuration, the shields of the plurality of electric wires can be grounded by one bracket. Therefore, the number of components required for grounding the shield can be reduced.

In the above wire harness, it is preferable that the protrusion has a tubular shape.

With this configuration, because the protrusion is interposed between the fastener and the electric wire over the entire circumference, it is possible to further suppress deformation of the electric wire due to fastening by the fastener.

In the above wire harness, it is preferable that the wire harness further includes a body made of resin that sandwiches the plate in a thickness direction, wherein the plate of the bracket includes a flange protruding radially outward from an entire circumference of the body, and the body and the bracket form an attachment to be attached to a device to which the wire harness is to be attached.

With this configuration, the body and the bracket form the attachment to be attached to a device to which the wire harness is to be attached.

Here, because the bracket is sandwiched by the body in the thickness direction, it is possible to prevent moisture or the like from entering from the outside to the inside of the housing of the device to which the attachment is to be attached through the insertion hole.

In the above wire harness, it is preferable that an annular groove is provided on an outer circumferential surface of the body, and an annular seal is fitted into the annular groove.

With this configuration, when the body of the attachment is inserted and attached to the attachment port of the housing of the device, the seal fitted into the annular groove of the body comes into intimate contact with the inner circumferential surface of the attachment port.

As a result, it is possible to prevent moisture or the like from entering the housing through a gap between the attachment port and the body.

According to the present disclosure, the shield can be grounded with a simple configuration.

DETAILED DESCRIPTION OF EMBODIMENTS

Hereinafter, an embodiment of a wire harness will be described with reference to FIGS. 1 to 6.

Figure 1:
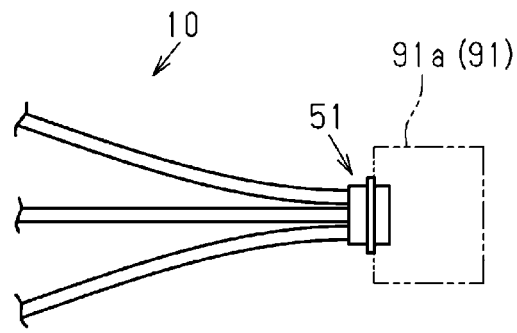
FIG. 1 is a plan view of a wire harness according to an embodiment of the present disclosure in a state where the wire harness is disposed between devices.

As shown in FIG. 1, a wire harness 10 is disposed in, for example, a hybrid vehicle or an electric vehicle, and electrically connects devices.

Figure 2:
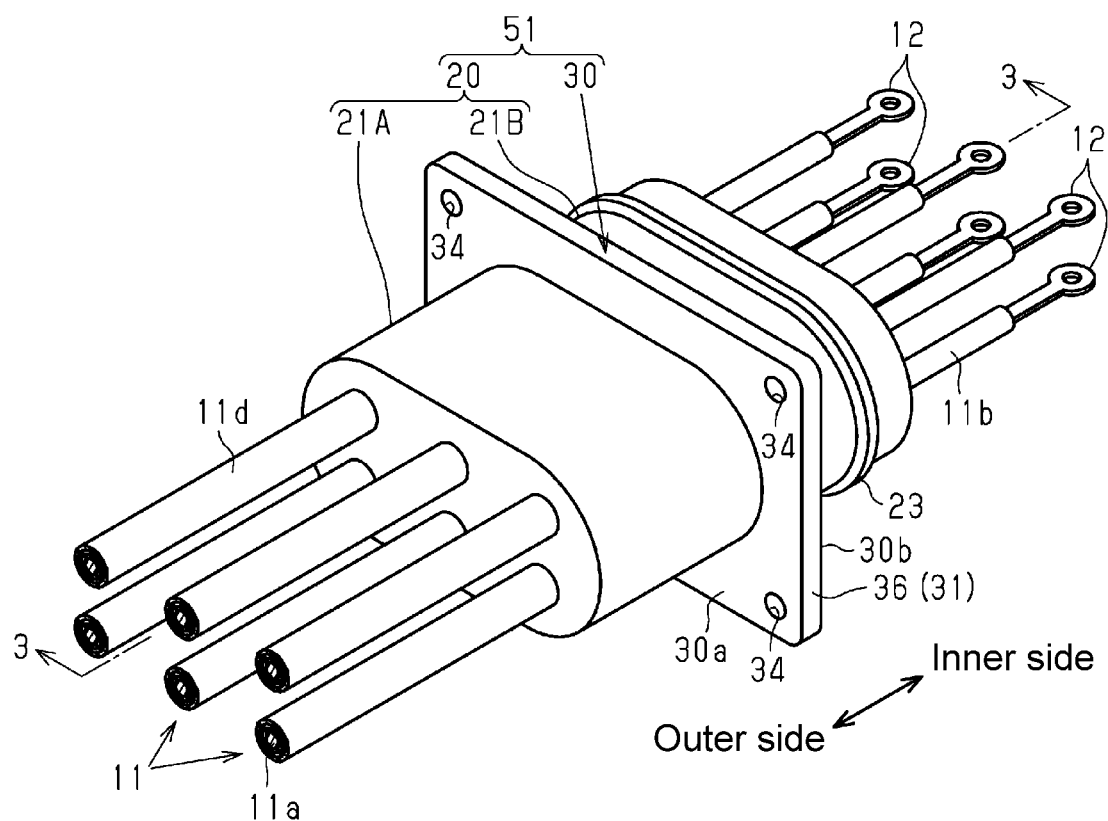
FIG. 2 is an enlarged perspective view of the wire harness of the embodiment of FIG. 1, with the attachment portion as a center.

As shown in FIGS. 1 and 2, the wire harness 10 includes a plurality of (six in the present embodiment) electric wires 11, and an attachment portion 51 (attachment) through which the electric wires 11 are inserted and that is to be attached to a housing 91*a* of a device 91.

The electric wires 11 that are led out from the attachment portion 51 are branched and respectively connected to devices (not shown).

Electric Wire 11

Figure 3:
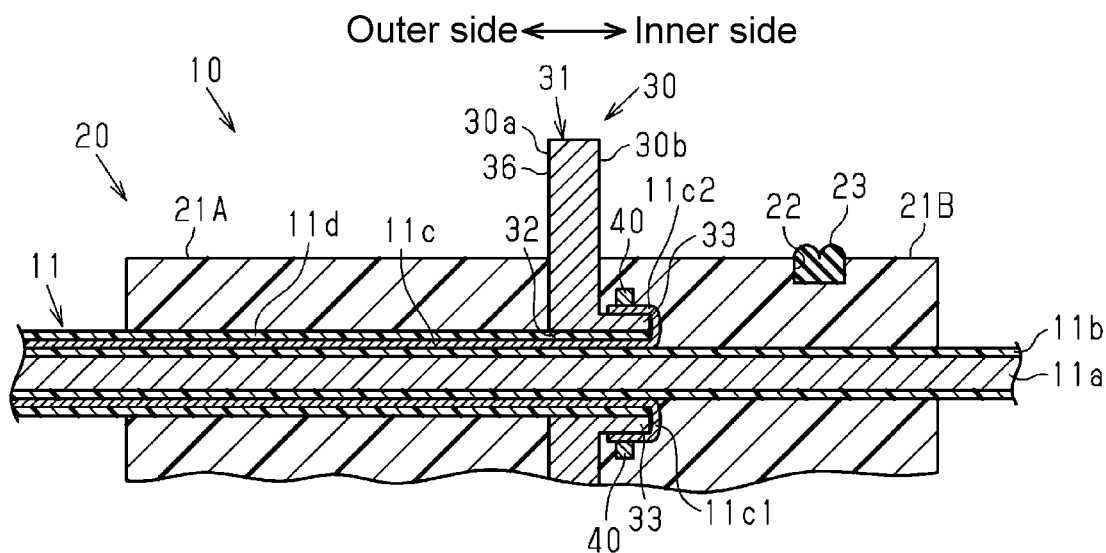
FIG. 3 is a cross-sectional view taken along line 3-3 of FIG. 2.

As shown in FIGS. 2 and 3, the electric wires 11 each include a core wire 11*a*, an insulating inner cover 11*b* that covers an outer circumference of the core wire 11*a*, a conductive shield member 11*c* (shield) that covers an outer circumference of the insulating inner cover 11*b*, and an insulating outer cover 11*d* that covers an outer circumference of the shield member 11*c*.

The core wire 11*a* is, for example, a stranded wire formed by twisting a plurality of bare metal wires made of a copper alloy. A terminal 12 to be connected to the device 91 is fixed to an end portion of the core wire 11*a* (see FIG. 2).

The insulating inner cover 11*b* is made of an electrically insulating synthetic resin material, and has a cylindrical shape.

The shield member 11*c* is made of a braided wire in which conductive bare wires made of an aluminum alloy or the like are woven in a cylindrical shape.

The insulating outer cover 11*d* is made of an electrically insulating synthetic resin material, and has a cylindrical shape.

Attachment Portion 51

As shown in FIG. 2, the attachment portion 51 is inserted to the attachment port of the housing 91*a* to be attached, and includes a bracket 30 and a molded portion 20 (body) that sandwiches the bracket 30 from both sides in a thickness direction and is provided integrally with the bracket 30.

The bracket 30 protrudes radially outward from the entire circumference of the molded portion 20, and this protruding portion functions as a flange portion 36 (flange) of the attachment portion 51.

The flange portion 36 is provided with attachment holes 34 for attaching it to the housing.

First, the configuration of the bracket 30 will be described. Hereinafter, the side of the bracket 30 that is closer to the terminals 12, that is, a housing 91*a* side may be referred to as an "inner side", and the side away from the terminals 12 may be referred to as an "outer side". A pair of surfaces of the bracket 30 extending in a direction intersecting or orthogonal to the longitudinal direction of the electric wires 11 may be referred to as a first surface 30*a* and a second surface 30*b*.

Figure 4:
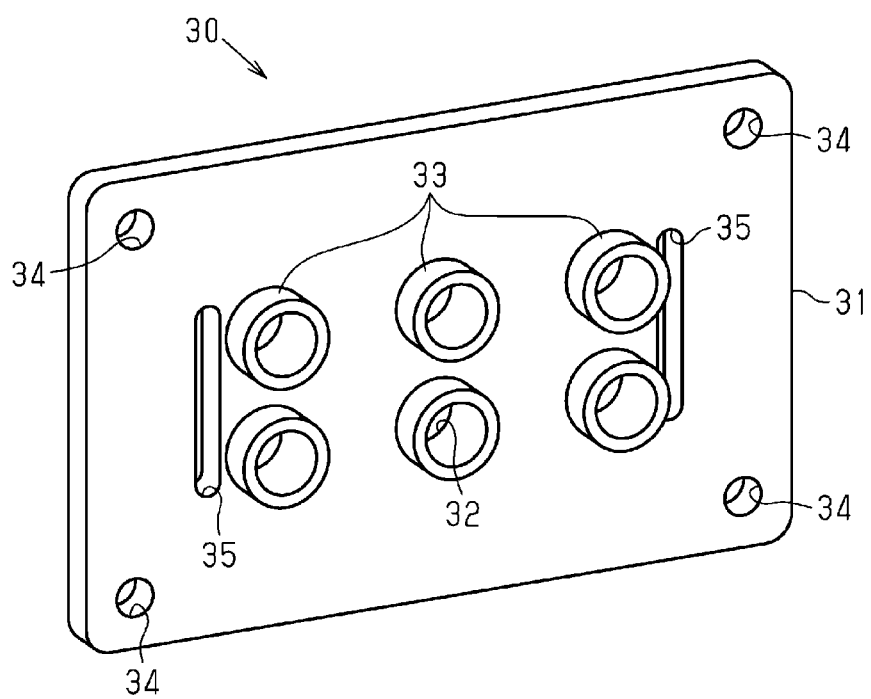
FIG. 4 is a perspective view of a bracket in the wire harness of the embodiment of FIG. 1.

As shown in FIG. 4, the bracket 30 includes a rectangular plate-shaped plate portion 31 (plate). The plate portion 31 is provided with a plurality of insertion holes 32 through which the respective electric wires 11 are inserted, and a plurality of cylindrical protruding portions 33 (protrusion) protruding inward from circumferential edges of the respective insertion holes 32.

The plate portion 31 is provided with a pair of communication holes 35 with the plurality of insertion holes 32 interposed therebetween.

The bracket 30 of the present embodiment is made of a metal material such as an aluminum alloy.

As shown in FIG. 3, the insulating outer cover 11*d* is removed from a portion of each electric wire 11 that protrudes inward from the protruding portion 33 of the bracket 30. A portion (also referred to as a predetermined-length end portion) 11*c*1 of the shield member 11*c* that protrudes inward from the protruding portion 33 is exposed from the insulating outer cover 11*d*. The exposed end portion 11*c*1 of each shield member 11*c* is folded back to form a folded-back portion 11*c*2, and the folded-back portion 11*c*2 covers the outer circumferential surface of the protruding portion 33. A conductive fastening member 40 (fastener) for fastening the folded-back portion 11*c*2 to the outer circumferential surface of the protruding portion 33 is provided on the outer circumference of the folded-back portion 11*c*2 of the shield member 11*c*. The fastening member 40 is, for example, a crimp ring made of an aluminum alloy or the like.

Next, the configuration of the molded portion 20 will be described.

The molded portion 20 is made of an electrically insulating synthetic resin material, and includes an outer portion 21A that is located outside the bracket 30, an inner portion 21B that is located inside the bracket 30, and a pair of connecting portions (not shown) that are located in the pair of communication holes 35 of the bracket 30 and connecting the outer portion 21A and the inner portion 21B.

The outer portion 21A and the inner portion 21B have a substantially columnar shape.

An annular groove 22 is provided on an outer circumferential surface of the inner portion 21B. An annular seal member 23 is fitted into the annular groove 22. When the attachment portion 51 is attached to the housing 91*a* by inserting the inner portion 21B into the attachment port of the housing 91*a*, the seal member 23 is brought into intimate contact with the inner circumferential surface of the attachment port.

Next, a method of manufacturing the wire harness 10 will be described with reference to FIGS. 5 and 6.

First, as shown in FIG. 5(*a*), a portion of the insulating outer cover 11*d* having a predetermined length from the end portion is removed to expose the shield member 11*c*.

Subsequently, of the exposed portion of the shield member 11*c*, a portion having a predetermined length from the end portion is removed to expose the insulating inner cover 11*b*.

Then, the electric wire 11 is inserted through the insertion hole 32 and the protruding portion 33 of the plate portion 31 in this order with the end portion where the insulating inner cover 11*b* is exposed forward.

Subsequently, as shown in FIG. 5(*b*), the end portion 11*c*1 of the shield member 11*c* exposed from the insulating outer cover 11*d* is folded back to the outer circumferential side of the protruding portion 33. As a result, the folded-back portion 11c2 of the shield member 11c is formed.

Figure 5A:
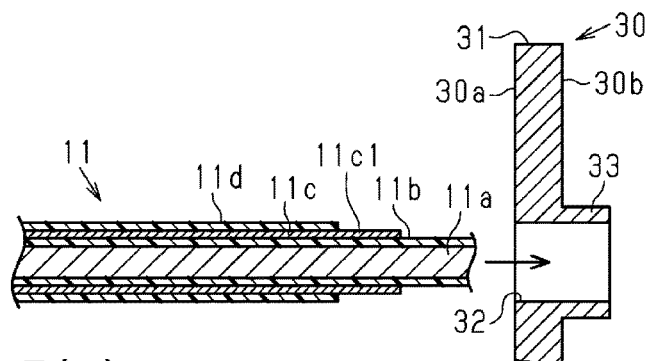
FIGS. 5 (*a*) to 5(*d*) are schematic views sequentially showing steps of manufacturing the wire harness in the embodiment of FIG. 1.
Figure 5B:
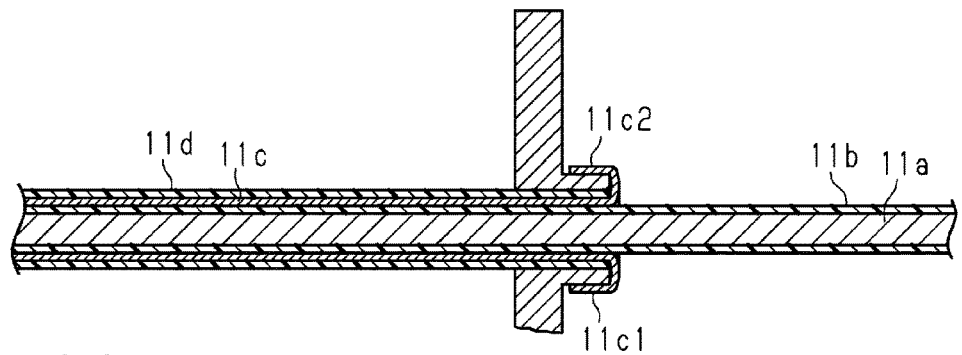
Figure 5C:
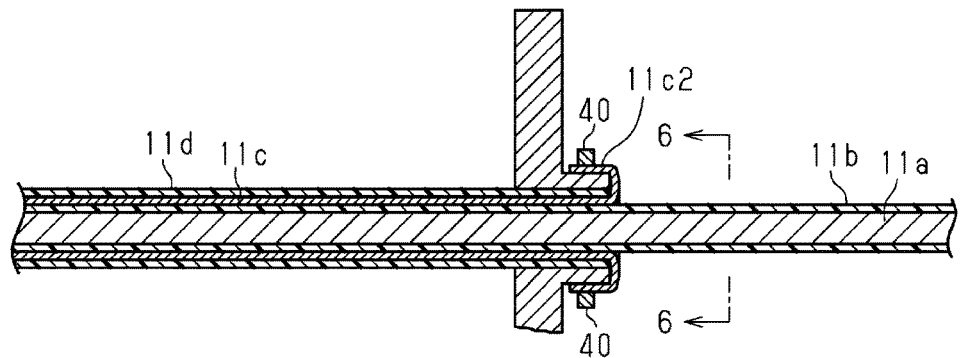
Figure 6:
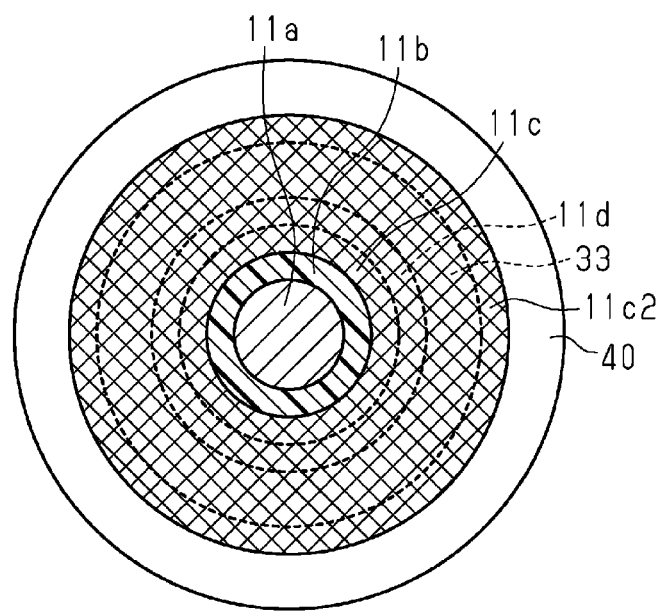
FIG. 6 is a cross-sectional view taken along line 6-6 of FIG. 5 (*c*).

Subsequently, as shown in FIGS. 5(c) and 6, the folded-back portion 11c2 of the shield member 11c is fastened to the outer circumferential surface of the protruding portion 33 with the fastening member 40.

Figure 5D:
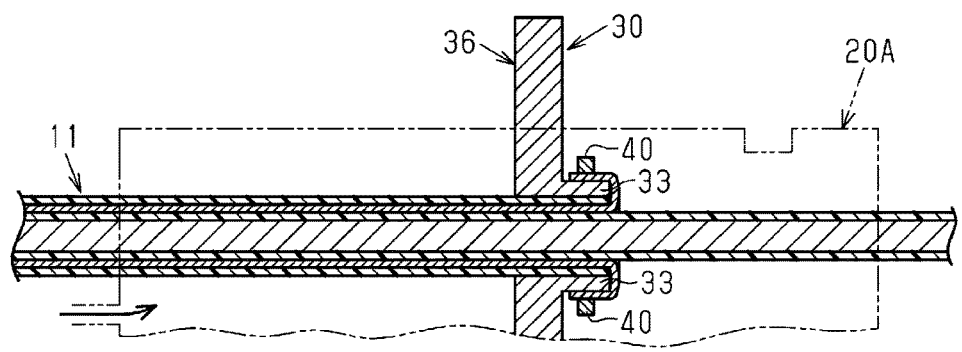

Thereafter, as indicated by the arrow in FIG. 5(d), the molded portion 20 is injection-molded by pouring molten plastic into a molding die 20A. At this time, the molten resin also flows from the outside of the bracket 30 to the inside of the bracket 30 through the communication holes 35.

As a result, part of the electric wires 11, the protruding portions 33 of the bracket 30, and the fastening members 40 are embedded in the molded portion 20.

Also, a portion of the bracket 30 that is not covered by the molded portion 20 forms the flange portion 36.

Next, the operation and effect of the present embodiment will be described.

(1) A wire harness 10 includes: a conductive bracket 30 including a plate portion 31 that includes an insertion hole 32 through which an electric wire 11 is inserted and a protruding portion 33 protruding from an edge of the insertion hole 32 in the plate portion 31; and a fastening member 40 that fastens a folded-back portion 11c2 of a shield member 11c that is folded back to an outer circumferential side of the protruding portion 33 to the protruding portion 33.

With this configuration, an end portion 11c1 of the shield member 11c, which is a portion of the shield member 11c of the electric wire 11 protruding from an end portion of the protruding portion 33 of the plate portion 31, is folded back to the outer circumferential side of the protruding portion 33 to form the folded-back portion 11c2. The folded-back portion 11c2 is configured to cover the opening end and the outer circumferential surface of the protruding portion 33. The shield member 11c is electrically connected to the plate portion 31 by fastening the folded-back portion 11c2 to the outer circumferential surface of the protruding portion 33 with the fastening member 40.

The shield member 11c can be grounded by attaching the plate portion 31 to a conductive housing 91a.

Here, because the protruding portion 33 is interposed between the fastening member 40 and the electric wire 11, deformation of the electric wire 11 due to fastening by the fastening member 40 is suppressed.

Therefore, the shield member 11c can be grounded with a simple configuration.

(2) The plate portion 31 includes a plurality of the insertion holes 32 and a plurality of the protruding portions 33 respectively protruding from edges of the insertion holes 32.

With this configuration, the shield members 11c of the plurality of electric wires 11 can be grounded with one plate portion 31. Therefore, the number of components required for grounding the shield members 11c can be reduced.

(3) Because each protruding portion 33 has a cylindrical shape, the protruding portion 33 is interposed between the fastening member 40 and the electric wire 11 over the entire circumference. As a result, it is possible to effectively suppress deformation of the electric wire 11 due to fastening by the fastening member 40.

(4) The wire harness 10 includes a molded portion 20 made of resin that sandwiches the bracket 30 in the thickness direction. The plate portion 31 includes a flange portion 36 protruding radially outward from the entire circumference of the molded portion 20. The molded portion 20 and the bracket 30 constitute an attachment portion 51.

With this configuration, the molded portion 20 and the bracket 30 constitute the attachment portion 51 of the wire harness 10.

Here, because the bracket 30 is sandwiched by the molded portion 20 in the thickness direction, it is possible to prevent moisture or the like from entering form the outside to the inside of the housing 91a to which the attachment portion 51 is to be attached through the insertion holes 32.

(5) An annular groove 22 is provided on the outer circumferential surface of the molded portion 20. An annular seal member 23 is fitted into the annular groove 22.

With this configuration, when the molded portion 20 (inner portion 21B) of the attachment portion 51 is inserted and attached to the attachment port 51 of the housing 91a, the seal member 23 that is fitted into the annular groove 22 of the molded portion 20 comes into intimate contact with the inner circumferential surface of the attachment port.

As a result, it is possible to prevent moisture or the like from entering the housing 91a through a gap between the attachment port and the molded portion 20.

(6) The plate portion 31 is provided with communication holes 35 that communicate with the bracket 30 in the thickness direction. The outer portion 21A and the inner portion 21B of the molded portion 20 are connected by the connecting portions filled in the communication holes 35.

With this configuration, the molded portion 20 and the bracket 30 can be firmly integrated.

The present embodiment can be modified and implemented as follows. The present embodiment and the following modified examples can be implemented in combination with each other within a technically consistent range.

In addition, in the following modified examples, the same components as those in the above embodiment are denoted by the same reference numerals. Further, with respect to the components corresponding to the above embodiment, "1" to which "100" is added to the reference numerals is added in the modified example illustrated in FIG. 7, "2" to which "200" is added to the reference numerals is added in the modified example illustrated in FIGS. 8 and 9, and "3**" to which "300" is added to the reference numerals is added in the modified example illustrated in FIG. 10. In this manner, description that overlaps with the above embodiment will be omitted.

Figure 7:
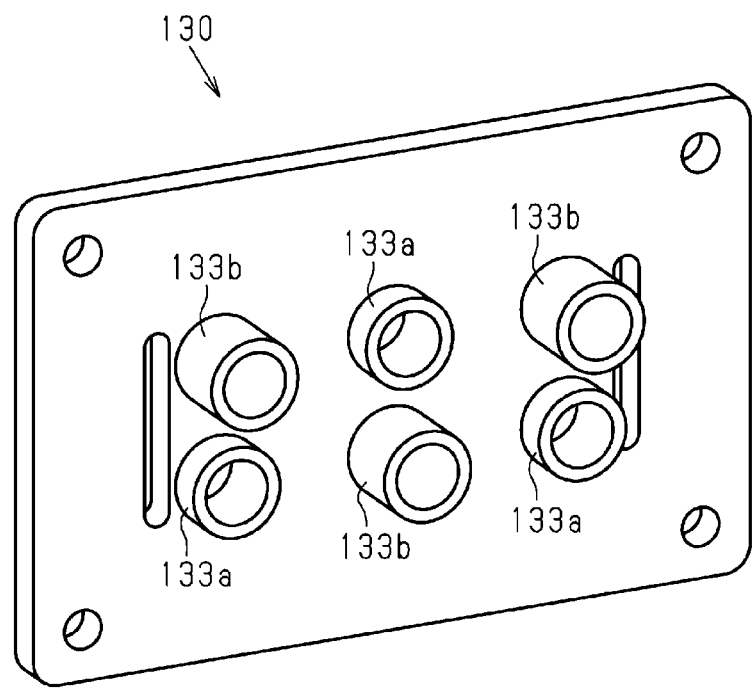
FIG. 7 is a perspective view of a bracket in a wire harness of a modified example.

As shown in FIG. 7, for example, the heights of adjacent protruding portions 133a and 133b can be different. In this case, the work of attaching the fastening members 40 to the outer circumference of the folded-back portions 11c2 of the shield members 11c that are folded back is facilitated.

Figure 8:
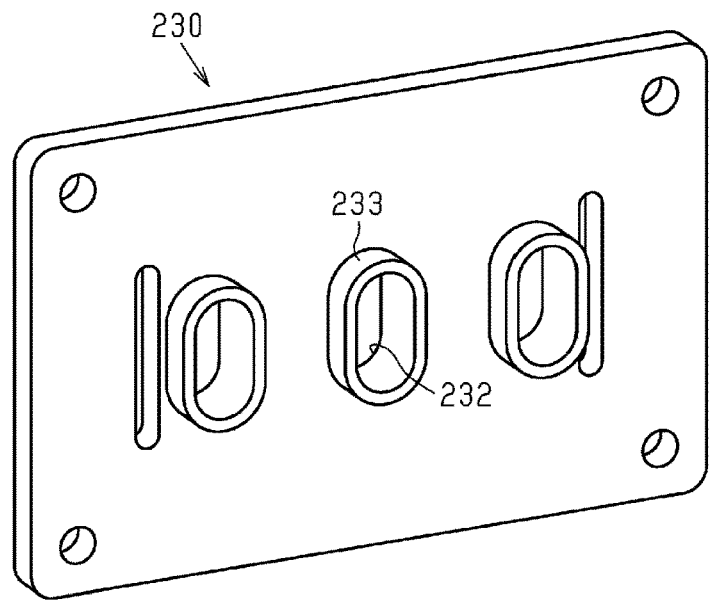
FIG. 8 is a perspective view of a bracket in a wire harness of another modified example.
Figure 9:
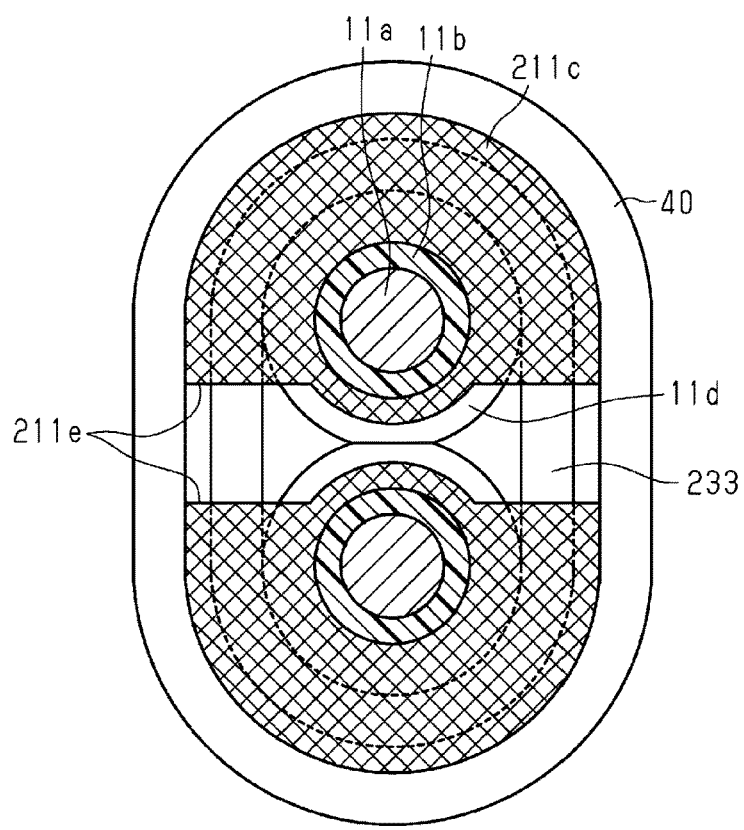
FIG. 9 is a cross-sectional view of the wire harness of FIG. 8, corresponding to FIG. 6.

As shown in FIG. 8, for example, insertion holes 232 may also have an oval shape. In this case, each protruding portion 233 is provided along the circumferential edge of the insertion hole 232. Further, in this case, as shown in FIG. 9, if a notch 211e is provided in a shield member 211c, the shield member 211c can be folded back to the outer circumferential side of the protruding portion 233. Also, the bracket may also be provided with only one insertion hole 232.

Figure 10:
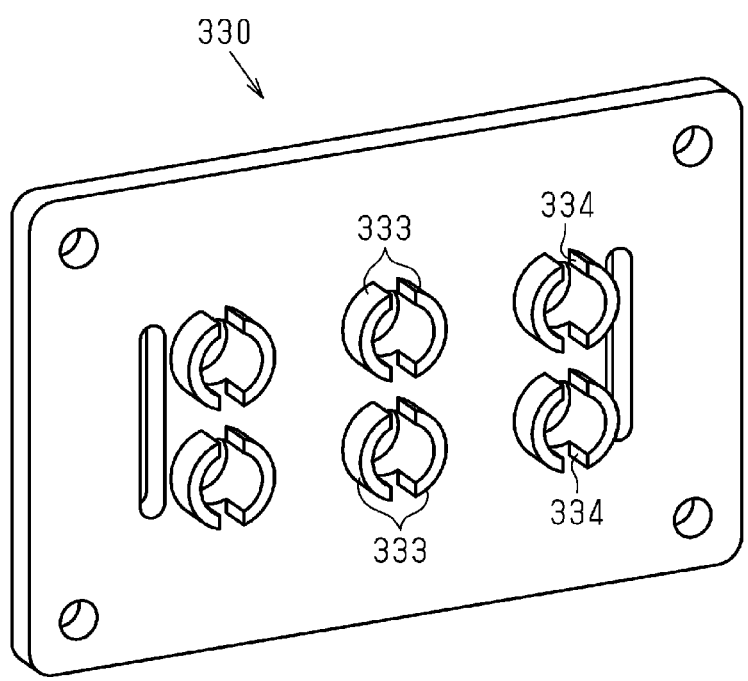
FIG. 10 is a perspective view of a bracket in the wire harness of the other modified example.

As shown in FIG. 10, a slit 334 extending along the axial direction can be provided on the side wall of each cylindrical protruding portion 333.

Instead of the molded portion 20, a resin portion formed by potting or the like may also be provided.

The inner circumferential surface and the outer circumferential surface of various elongated members such as the insulating inner cover 11b may be referred to as a radially inward surface and a radially outward surface, respectively.

The shield member (11c) may be referred to as a braided tube made of conductive metals. The molded portion (20) may be referred to as a molded block.

The present disclosure encompasses the following implementations. Reference numerals have been given to components of the embodiment as an aid to understanding, not for limitation.

Additional Remark 1

A wire harness (10) according to some implementations includes: an electric wire (11) including a conductive metal core wire (11a), an insulating inner cover (11b) that is in intimate contact with the entire circumference of a radially outward surface of the core wire (11a), and a shield member (11c) that is a conductive metal braided tube that covers a radially outward surface of the insulating inner cover (11b); a conductive metal bracket (30), the bracket (30) having a first surface (30a) extending to intersect a longitudinal direction of the electric wire (11), a second surface (30b) opposite to the first surface (30a), a protruding portion (33) that protrudes from the second surface (30b) and includes an opening end, and an insertion hole (32) that linearly extends from the first surface (30a) to the opening end of the protruding portion (33) of the bracket (30), and the electric wire (11) being inserted through the insertion hole (32), and a radially outward surface of the protruding portion (33) extending between the opening end of the protruding portion (33) and the second surface (30b) of the bracket (30); and a molded block (20) that is made of an insulating resin and constitutes an attachment portion (51) for fixedly attaching the wire harness (10) to an electric device (91) in cooperation with the bracket (30), wherein the shield member (11c) includes a predetermined-length end portion (11c1) that is separated radially outward from the radially outward surface of the insulting inner cover (11b), the predetermined-length end portion (11c1) of the shield member (11c) covers the opening end of the protruding portion (33) and the radially outward surface of the protruding portion (33), and forms a folded-back portion (11c2) that electrically contacts at least the radially outward surface of the protruding portion (33), the wire harness (10) further includes a fastening member (40) for fixedly fastening the folded-back portion (11c2) of the shield member (11c) to the radially outward surface of the protruding portion (33), and the protruding portion (33) of the bracket (30), the folded-back portion (11c2) of the shield member (11c), and the fastening member (40) are embedded in the molded block (20).

Additional Remark 2

The wire harness (10) according to some implementations further includes an insulating outer cover (11d) that covers the shield member (11c) and that is in contact with an entire circumference of a radially inward surface of the insertion hole (32) of the bracket (30).

Additional Remark 3

In the wire harness (10) according to some implementations, the insulating outer cover (11d) terminates at the opening end of the protruding portion (33) of the bracket (30), and does not protrude in the axial direction from the opening end of the protruding portion (33) of the bracket (30).

Additional Remark 4

In some implementations, the protruding portion (33) is a tubular protruding portion.

It will be apparent to those skilled in the art that the present disclosure may be embodied in other specific forms without departing from the technical idea thereof. Some of the components described in the embodiment (or one or more aspects thereof) may be omitted, or some components may be combined, for example. The scope of the present disclosure should be determined with reference to the appended claims, along with the full scope of equivalents to which the claims are entitled.

The invention claimed is:

1. A wire harness comprising:
an electric wire that includes a core wire, an insulating inner cover that covers an outer circumference of the core wire, and a conductive shield that covers an outer circumference of the insulating inner cover;
a conductive bracket including a plate that includes an insertion hole through which the electric wire is inserted and a protrusion protruding from an edge of the insertion hole in the plate;
a fastener that fastens a folded-back portion of the shield that is folded back to an outer circumferential side of the protrusion to the protrusion; and
a body made of resin that sandwiches the plate in a thickness direction, wherein
the plate of the bracket includes a flange protruding radially outward from an entire circumference of the body, and
the body and the bracket form an attachment to be attached to a device to which the wire harness is to be attached.

2. The wire harness according to claim 1, wherein the insertion hole and the protrusion include a plurality of insertion holes and a plurality of protrusions respectively protruding from edges of the insertion holes.

3. The wire harness according to claim 1, wherein the protrusion has a tubular shape.

4. The wire harness according to claim 1, wherein an annular groove is provided on an outer circumferential surface of the body, and an annular seal is fitted into the annular groove.

5. The wire harness according to claim 1, wherein the shield is grounded via the bracket.

6. The wire harness according to claim 1, wherein the body includes a first body and a second body, and the bracket is disposed between the first body and the second body.

* * * * *